(12) United States Patent
Loechelt et al.

(10) Patent No.: US 7,902,601 B2
(45) Date of Patent: *Mar. 8, 2011

(54) SEMICONDUCTOR DEVICE HAVING DEEP TRENCH CHARGE COMPENSATION REGIONS AND METHOD

(75) Inventors: Gary H. Loechelt, Tempe, AZ (US);
John M. Parsey, Jr., Phoenix, PA (US);
Peter J. Zdebel, Austin, TX (US);
Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 210 days.

This patent is subject to a terminal disclaimer.

(21) Appl. No.: 12/335,730

(22) Filed: Dec. 16, 2008

(65) Prior Publication Data

US 2009/0096021 A1    Apr. 16, 2009

Related U.S. Application Data

(60) Division of application No. 11/582,889, filed on Oct. 19, 2006, now Pat. No. 7,482,220, which is a continuation-in-part of application No. 11/057,140, filed on Feb. 15, 2005, now Pat. No. 7,176,524.

(51) Int. Cl.
*H01L 29/66* (2006.01)
(52) U.S. Cl. ......... 257/339; 257/133; 257/139; 257/140; 257/146; 257/147; 257/162; 257/342; 257/900; 257/E29.013; 257/E29.174; 257/E29.243; 257/E29.26
(58) Field of Classification Search ................... 257/900, 257/E21.418, E29.257, 133, 139, 140, 146, 257/147, 162, 339, 342, E29.013, E29.174, 257/E29.243, E29.26
See application file for complete search history.

(56) References Cited

U.S. PATENT DOCUMENTS

| | | | | |
|---|---|---|---|---|
| 5,571,738 | A * | 11/1996 | Krivokapic | 438/291 |
| 6,576,516 | B1 * | 6/2003 | Blanchard | 438/268 |
| 7,019,360 | B2 * | 3/2006 | Blanchard et al. | 257/329 |
| 2004/0206989 | A1 * | 10/2004 | Aida et al. | 257/263 |

* cited by examiner

*Primary Examiner* — Long K Tran
(74) *Attorney, Agent, or Firm* — Kevin B. Jackson

(57) ABSTRACT

In one embodiment, a semiconductor device is formed in a body of semiconductor material. The semiconductor device includes a charge compensating trench formed in proximity to active portions of the device. The charge compensating trench includes a trench filled with various layers of semiconductor material including opposite conductivity type layers.

19 Claims, 14 Drawing Sheets

SEMICONDUCTOR DEVICE HAVING DEEP TRENCH CHARGE COMPENSATION REGIONS AND METHOD

RELATED U.S. APPLICATION DATA

The present application is a divisional application based on prior U.S. application Ser. No. 11/582,889 now U.S. Pat. No. 7,482,220 filed on Oct. 19, 2006, which is a continuation-in-part application based on U.S. application Ser. No. 11/057,140 now U.S. Pat. No. 7,176,524 filed on Feb. 15, 2005. Both of these documents are hereby incorporated by reference, and priority thereto for common subject matter is hereby claimed.

BACKGROUND OF THE INVENTION

This invention relates generally to semiconductor devices, and more specifically to power switching devices and methods of their manufacture.

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

Today's high voltage power switch market is driven by two major parameters: breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In a conventional n-channel superjunction device, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. Although superjunction devices look promising, significant challenges still exist in manufacturing them.

Another problem with present high voltage power switch products is that they typically require a large input (e.g., gate or control electrode) charge for switching from one state to another. This requirement places, among other things, an extra burden on peripheral control circuitry.

Accordingly, high voltage power switching device structures and methods of manufacture are needed that provide lower Rdson, high BVdss, and that reduce input charge.

DETAILED DESCRIPTION OF A PREFERRED EMBODIMENT

Figure 1:
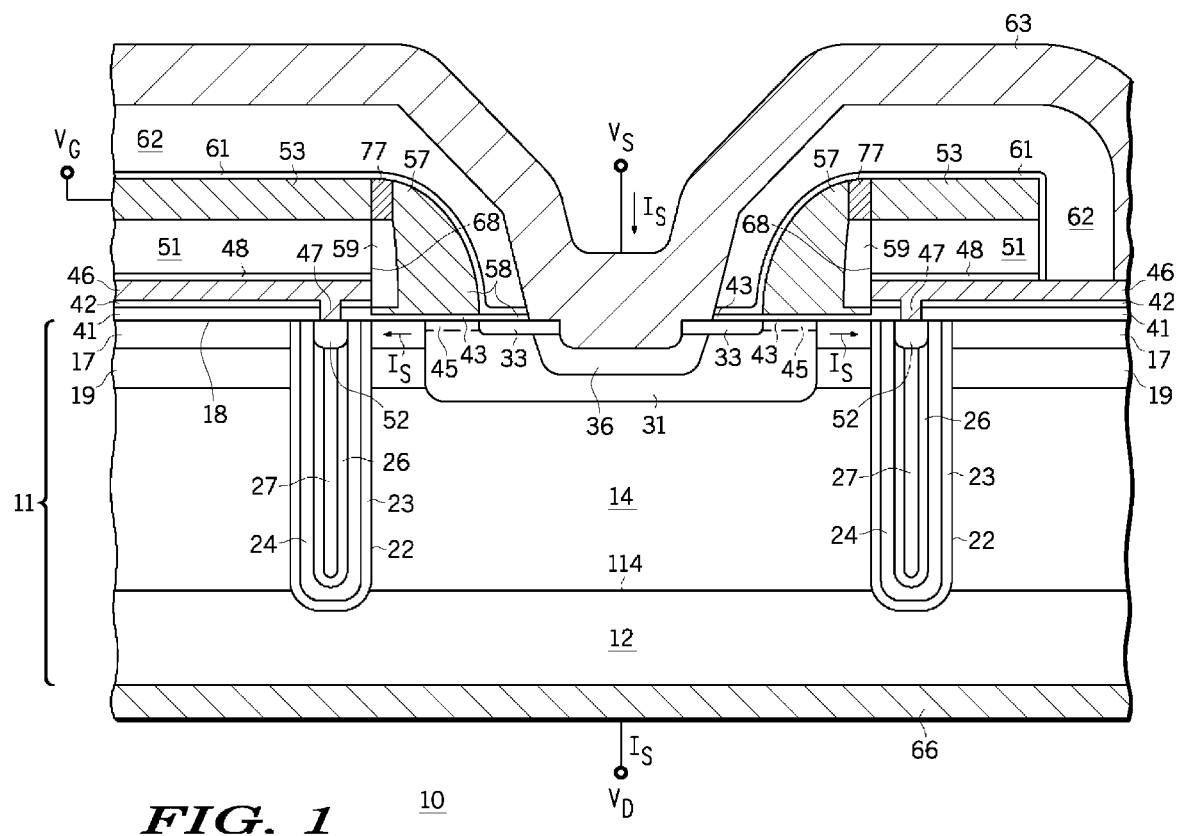
FIG. 1 illustrates an enlarged partial cross-sectional view of a switching device in accordance with the present invention.

For ease of understanding, elements in the drawing figures are not necessarily drawn to scale, and like element numbers are used where appropriate throughout the various figures. While the discussion below describes an n-channel device, the invention also pertains to p-channel devices, which may be formed by reversing the conductivity type of the described layers and regions.

In addition, the device of the present invention may embody either a cellular design (where the body regions are a plurality of cellular regions) or a single body design (where the body region is compromised of a single region formed in an elongated pattern, typically in a serpentine pattern). However, the device of the present invention will be described as a cellular design throughout the description for ease of understanding. It should be understood that it is intended that the present invention encompass both a cellular design and a single base design.

FIG. 1 shows an enlarged partial cross-sectional view of an insulated gate field effect transistor (IGFET), MOSFET, superjunction device, or switching device or cell 10 in accordance with the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in a range of approximately 0.001 to about 0.005 ohm-cm, and may be doped with arsenic. In the embodiment shown, substrate 12 provides a drain contact. A semiconductor layer 14 is formed in or on substrate 12, and in accordance with the present invention is lightly doped n-type or p-type, or contains negligible amounts of impurities (i.e., is intrinsic). In an exemplary embodiment, layer 14 is formed using conventional epitaxial growth techniques. In an exemplary embodiment suitable for a 750 volt device, layer 14 is p-type with a dopant concentration of about $1.0 \times 10^{13}$ atoms/cm$^3$ to about $5.0 \times 10^{13}$ atoms/cm$^3$, and has a thickness on the order of about 40 microns. The thickness of layer 14 is increased or decreased depending on the desired BVdss rating of device 10. It is understood that other materials may be used for body of semiconductor material 11 or portions thereof including silicon-germanium, silicon-germanium-carbon, carbon doped silicon, or the like.

Device 10 also includes an n-type region or blanket layer 17 formed in or adjacent to upper or major surface 18 of region of semiconductor material 11. N-type region 17 provides a low resistance current path for device 10 as will be described in more detail below. In an exemplary embodiment, n-type region 17 has a maximum concentration on the order of about $6.0 \times 10^{16}$ atoms/cm$^3$, and a depth of about 0.4 microns. Optionally, a p-type region or blanket layer 19 is formed in or adjacent to major surface 18, and is below or adjacent to n-type region 17. P-type region 19 provides better control of the pn junction between n-type region 17 and semiconductor layer 14, and provides charge compensation for n-type region 17 under full depletion conditions. In an exemplary embodiment, p-type region 19 has surface concentration of about $5.0 \times 10^{15}$ atoms/cm$^3$, and a depth of about 0.8 microns.

Device 10 further includes filled trenches, semiconductor material filled trenches, epitaxial filled regions or trenches, charge compensating trench regions, deep trench charge compensation regions, charge compensating filled trenches or charge compensation regions 22 in accordance with the present invention. Charge compensating filled trenches 22 include a plurality of layers or multiple layers of semiconductor material, including layers of opposite conductivity type, which are preferably separated by an intrinsic or buffer semiconductor layer or layers. The intrinsic layer functions, among other things, to prevent intermixing of the opposite conductivity type layers (i.e., the two charge layers), which would negatively impact the conduction efficiency of device 10 in the on state.

In an exemplary embodiment, filled trenches 22 include multiple layers or stacked layers of semiconductor material formed using epitaxial growth techniques. For example, filled trenches 22 include an n-type layer 23 formed on, over, or adjoining the trench walls or surfaces adjacent to body of semiconductor material 11. An intrinsic semiconductor or buffer layer 24 is formed on, over, or adjoining n-type layer 23, a p-type layer 26 is formed on, over, or adjoining intrinsic semiconductor layer 24, and an intrinsic semiconductor or buffer layer 27 is formed on, over, or adjoining p-type layer 26. Intrinsic layer 24 functions, among other things, to prevent the mixing of layers 23 and 26, which, as stated previously, improves the conduction efficiency of device 10. Intrinsic layer 27 functions, among other things, to fill the remainder of the trench. For an n-channel device and in accordance with the present invention, n-type layers 23 provide a primary vertical low resistance current path from the channel to the drain when device 10 is in an on state. When device 10 is an off state, n-type layers 23 and p-type layers 26 compensate each other in accordance with the present invention to provide an increased BVdss characteristic. It is understood that additional n-type and p-type layers may be used, and preferably separated by additional intrinsic or buffer layers.

By way of example, n-type layers 23 and p-type layers 26 each have a dopant concentration on the order of about $2.0 \times 10^{16}$ to about $4.0 \times 10^{16}$ atoms/cm$^3$, and each have a thickness of about 0.1 microns to about 0.3 microns. In an exemplary embodiment, intrinsic semiconductor or buffer layers 24 and 27 are undoped or very lightly doped p-type with a dopant concentration of less than about $2.0 \times 10^{14}$ atoms/cm$^3$, and each has a thickness of about 0.5 microns to about 1.0 microns. The thickness of layer 27 is adjusted, for example, to fill the balance of the trench.

A body or doped region 31 is formed in semiconductor layer 14 between and in proximity or adjacent to filled trenches 22, and extends from major surface 18. In an exemplary embodiment, body region 31 comprises p-type conductivity, and has a dopant concentration suitable for forming an inversion layer that operates as conduction channels 45 of device 10 as described below. Body region 31 extends from major surface 18 to a depth of about 1.0 to about 5.0 microns. An n-type source region 33 is formed within or in body region 31 and extends from major surface 18 to a depth of about 0.2 microns to about 0.5 microns. A p-type body contact or contact region 36 is also formed in body region 31, and provides a lower contact resistance to body region 31 at major surface 18. In addition, contact region 36 lowers the sheet resistance of body region 31 under source region 33, which suppresses parasitic bipolar effects.

A first dielectric layer 41 is formed over or adjoining portions of major surface 18. In an exemplary embodiment, dielectric layer 41 comprises a thermal oxide layer having a thickness of about 0.1 microns to about 0.2 microns. A second dielectric layer 42 is formed over dielectric layer 41. In an exemplary embodiment, second dielectric layer 42 comprises silicon nitride, and has a thickness of about 0.1 microns.

Gate dielectric layers 43 are formed over or adjoining other portions of major surface 18 adjacent to body region 31. In an exemplary embodiment, gate dielectric layer 43 comprises silicon oxide, and has a thickness of about 0.05 microns to about 0.1 microns. In alternative embodiments, gate dielectric layer 43 comprises silicon nitride, tantalum pentoxide, titanium dioxide, barium strontium titanate, or combinations thereof including combinations with silicon oxide, or the like.

In accordance with an embodiment of the present invention, a doped polycrystalline semiconductor layer, conductive layer, or ground plane layer 46 is formed over dielectric layers 41 and 42, and contacts p-type layers 26 through openings 47 formed in dielectric layers 41 and 42. In an exemplary embodiment, conductive layer 46 comprises a polysilicon layer, has a thickness of about 0.1 microns, and has p-type conductivity for an n-channel device. When heat treated, p-type dopant from conductive layer 46 diffuses into filled trenches 22 to form p-type doped regions 52, which enhance ohmic contact to p-type layers 26. In an alternative embodiment, conductive layer 46 comprises amorphous silicon, a metal, a silicide, or combinations thereof including combinations with polysilicon. If a metal is used for conductive layer 46, p-type dopant is first implanted or deposited through openings 47 to form p-type doped regions 52 to enhance ohmic contact to p-type layers 26. Conductive layer 46 preferably is tied or coupled directly or indirectly to a conductive contact or source contact layer 63 as shown in FIG. 1.

In accordance with the present invention, conductive layer 46 functions, among other things, as a ground plane to provide a path for minority carriers to be swept from or out of the device faster and more efficiently, which reduces the input charge required for switching device 10 from one state to another and enhances switching speed. Additionally, as will be explained in more detail below, conductive layer 46 is further used as part of an edge termination structure in accordance with the present invention.

A third dielectric layer 48 is formed over conductive layer 46, and a fourth dielectric layer 51 is formed over third dielectric layer 48. In an exemplary embodiment, dielectric layer 48 comprises silicon nitride (e.g., about 0.05 microns in thickness), and dielectric layer 51 comprises a deposited silicon oxide (e.g., about 0.7 microns in thickness). A conductive layer 53 is formed over dielectric layer 51, and comprises for example, n-type polysilicon (e.g., about 0.3 microns in thickness).

Conductive spacer gate regions, vertical spacer gate regions, or spacer defined gate regions 57 are formed over gate dielectric layers 43, and are isolated from conductive layer 46 by dielectric spacers 59. Conductive spacer gate regions 57 together with gate dielectric layers 43 form a control electrode or gate structure 58. Conductive spacer gate regions 57 comprise, for example, n-type polysilicon, and are about 0.8 microns in thickness. In an exemplary embodiment, dielectric spacers 59 comprise silicon nitride, and are about 0.1 microns in thickness. Spacer gate regions 57 are coupled to conductive layer 53 to provide a conductive gate structure, which controls the formation of channel 45 and the conduction of current in device 10. In the embodiment shown, a conductive connective portion 77 couples spacer gate regions 57 to conductive layers 53. Conductive connective portions 77 comprise for example, n-type polysilicon. A spacer gate region refers to a control electrode formed with gate material deposited on one surface to control a channel formed on another perpendicular surface. In the case of device 10, channels 45 are formed at surface 18, which is considered a horizontal surface. The control electrode film used to form spacer gate regions 57 is deposited along vertical surfaces 68, which are perpendicular to surface 18.

Conductive spacer gate regions 57 in accordance with the present invention provide a minimal gate to drain overlap compared to conventional devices, thereby significantly reducing gate charge. Additionally, in device 10 the electrical routing for the gate is provided by conductive layer 53, which is elevated above major surface 18 thereby further reducing gate charge. Further, conductive layer 46 functions, among other things, as a ground plane interposed between the gate and drain regions to further reduce gate to drain capacitance. These features of the present invention provide enhanced switching speed and reduced input charge requirements.

A fifth dielectric layer 61 is formed over portions of device 10, and comprises for example, silicon nitride having thickness of about 0.05 microns. An interlayer dielectric (ILD) layer 62 is formed over portions of device 10, and comprises for example, a deposited silicon oxide having a thickness of about 0.8 microns. An opening is formed in the dielectric layers to provide a contact to device 10 for source contact layer 63. As shown, a portion of major surface 18 is etched so that source contact layer 63 makes contact to both source regions 33 and body region 36. In an exemplary embodiment, source contact layer 63 comprises an aluminum silicon alloy or the like. A drain contact layer 66 is formed on an opposing surface of region of semiconductor material 11, and comprises, for example, a solderable metal structure such a titanium-nickel-silver, chrome-nickel-gold, or the like.

The operation of device 10 proceeds as follows. Assume that source terminal 63 is operating at a potential $V_S$ of zero volts, spacer gate regions 57 receive a control voltage $V_G$=5.0 volts, which is greater than the conduction threshold of device 10, and drain terminal 66 operates at drain potential $V_D$=5.0 volts. The values of $V_G$ and $V_S$ cause body region 31 to invert under spacer gate regions 57 to form channels 45, which electrically connect source regions 33 to layer 17. A device current $I_S$ flows from source terminal 63 and is routed through source regions 33, channel 45, layer 17, n-type layers 23 to drain terminal 66. Hence, current $I_S$ flows vertically through n-type layers 23 to produce a low on resistance. In one embodiment, $I_S$=1.0 amperes. To switch device 10 to the off state, a control voltage $V_G$ of less than the conduction threshold of device is applied to spacer gates 57 (e.g., $V_G$<5.0 volts). This removes channels 45, $I_S$ no longer flows through device 10, and conductive layer 46 sweeps minority carriers out of the device. In the off state, n-type layers 23 and p-type layers 26 compensate each other as the depletion region from the primary blocking junction spreads, which enhances BVdss. In one embodiment, the primary blocking junction is formed by body region 31 and semiconductor layer 14 when layer 14 is n-type. In another embodiment, the primary blocking junction is formed by semiconductor layer 14 and substrate 12 when layer 14 is p-type.

Figure 2:
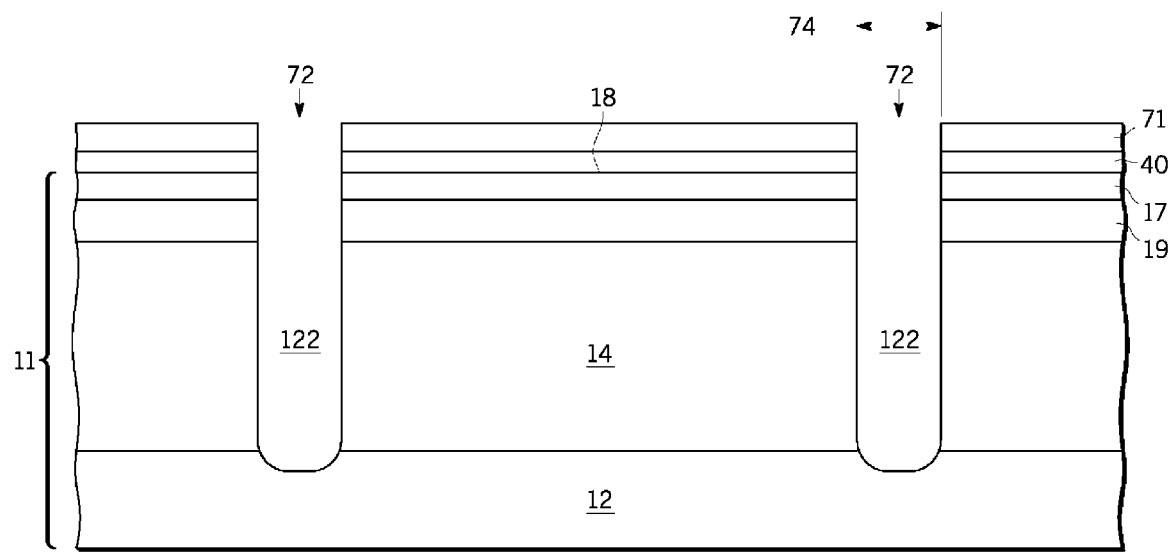
FIGS. 2-7 illustrate enlarged partial cross-sectional views of the switching device of FIG. 1 at various stages of fabrication.

Turning now to FIGS. 2-7, a process for forming device 10 in accordance with the present invention is described. FIG. 2 shows an enlarged partial cross-sectional view of device 10 at an early stage of fabrication. In an early step, a dielectric layer 40 is formed over major surface 18, and optional p-type region 19 is ion implanted into semiconductor layer 14 through dielectric layer 40. In an exemplary embodiment, boron is implanted at a dose of about $5.0 \times 10^{11}$ atoms/cm² and an implant energy of 600 KeV to form p-type layer 19. Next n-type layer 17 is ion implanted into semiconductor layer 14 through dielectric layer 40. In an exemplary embodiment, phosphorous is implanted at a dose of about $2.0 \times 10^{12}$ atoms/cm² and an implant energy of 600 KeV to form n-type layer 17.

Masking layer 71 is then formed over major surface 18 and patterned to form openings 72. Dielectric layer 40 is then etched using conventional techniques to expose portions of body of semiconductor material 11 through openings 72. By way of example, openings 72 have a width 74 on the order of about 3.0 microns to about 5.0 microns. Next, trenches 122 are etched through layers 17, 19, and 14. In an exemplary embodiment, trenches 122 extend into at least a portion of substrate 12. The depth of trenches 122 is determined by the thickness of semiconductor layer 14, which is a function of BVdss. In an exemplary embodiment, Deep Reactive Ion Etching (DRIE) etching with a fluorine or chlorine based chemistry is used to form trenches 122. Several techniques are available for DRIE etching including cryogenic, high density plasma, or Bosch DRIE processing. In an exemplary embodiment, trenches 122 have substantially vertical sidewalls. In an alternative embodiment, trenches 122 have a tapered profile where the width of the trench at the trench lower surface is less than width 74. Masking layer 71 is removed after trenches 122 are formed using conventional etch techniques. Although trenches 122 are stated as plural, it is understood that trenches 122 may be a single continuous trench or connected trench matrix (e.g., such as that shown in FIG. 10 and described below). Alternatively, trenches 122 may be a plurality of individual trenches with closed ends and separated by portions of body of semiconductor material 11.

Figure 3:
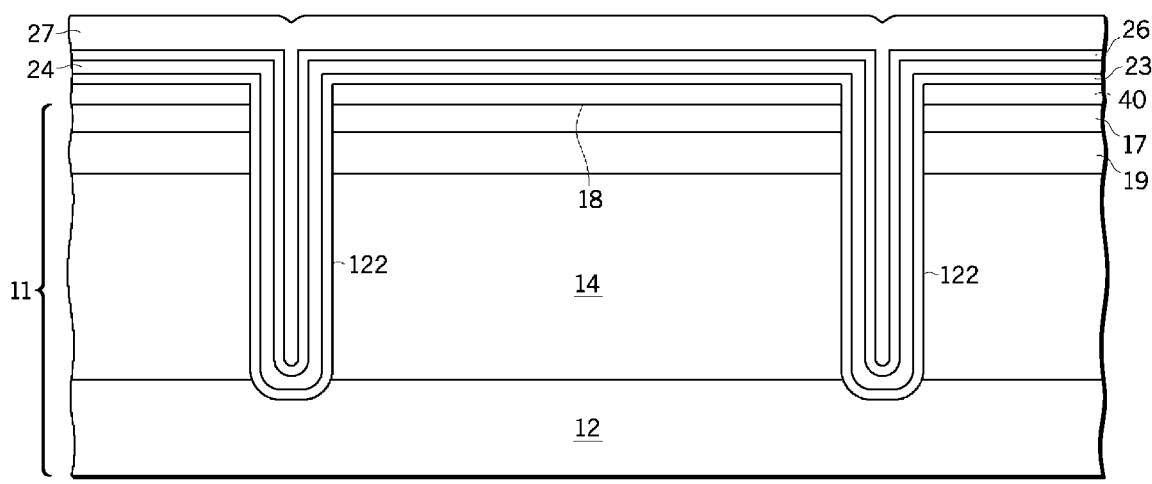

FIG. 3 shows an enlarged partial cross-sectional view of device 10 at a further stage of processing. At this point, layers of semiconductor material are formed, grown, or deposited in trenches 122 as a first stage in forming filled trenches 22. In an exemplary embodiment, semiconductor epitaxial growth techniques are used to fill trenches 122.

In a first step, a thin thermal oxide is formed on the sidewalls of trenches 122 to remove any surface damage caused by the DRIE step. The thin thermal oxide is then removed using conventional isotropic etching techniques. Next, body of semiconductor material 11 is placed into an epitaxial growth reactor and pre-cleaned as a first step of the epitaxial growth process. When silicon is the selected semiconductor material for the fill layers (e.g., layers 23, 24, 26, and 27), silicon source gases such as $SiHCl_3$, $SiH_2Cl_2$, $SiH_4$ or $Si_2H_6$ are suitable for forming these layers. In the embodiment shown, blanket layers are grown (i.e., the layers are grown over major surface 18 in addition to trenches 122). In an alternative embodiment, selective epitaxial growth techniques are used to form layers 23, 24, 26, and 27 so that these layers are not formed over dielectric layer 40.

N-type layer 23 is grown first along the surfaces of trenches 122, with arsenic being a suitable dopant source. In an exemplary embodiment, n-type layer 23 has a dopant concentration on the order of about $2.0 \times 10^{16}$ to about $4.0 \times 10^{16}$ atoms/cm$^3$, and a thickness of about 0.1 microns to about 0.3 microns.

Next, intrinsic or buffer layer 24 is grown over n-type layer 23, and is either undoped (except for those trace impurities typically present in the silicon source material and/or residual dopant gases remaining in the reactor chamber after the previous growth step), or is very lightly doped p-type with a dopant concentration of less than about $2.0 \times 10^{14}$ atoms/cm$^3$. Layer 24 has a thickness of about 0.5 microns to about 1.0 microns. P-type layer 26 is then grown over layer 24, with a boron dopant source being suitable. In an exemplary embodiment, p-type layer 26 has a dopant concentration on the order of about $2.0 \times 10^{16}$ to about $4.0 \times 10^{16}$ atoms/cm$^3$, and a thickness of about 0.1 microns to about 0.3 microns. Intrinsic or buffer layer 27 is then grown over p-type layer 26, and is either undoped (except for those trace impurities typically present in the silicon source material and/or residual dopant gases remaining in the reactor chamber after the previous growth step), or is very lightly doped p-type with a dopant concentration of less than about $2.0 \times 10^{14}$ atoms/cm$^3$. Layer 27 has a thickness of about 0.5 microns to about 1.0 microns. It should be understood that the thicknesses of layers 23, 24, 26, and 27 are adjusted depending on the width of trenches 122. In an exemplary embodiment, the thicknesses of these layers are such that the resultant epitaxial layers overfill trenches 122. When a blanket epitaxial growth process is used, layers 27, 26, 24, and 23 are subsequently planarized with chemical mechanical polishing techniques, etch-back techniques, combinations thereof, or the like. During the planarization process, epi layers 27, 26, 24, and 23 are planarized down or back to major surface 18 to form filled trenches 22. In an embodiment, the planarization process removes dielectric layer 40 as well. An additional etching step may be used to further remove any residual dielectric material from layer 40. If selective epitaxial growth or selective etch back techniques are used, dielectric layer 40 may remain, and would replace layer 41 as described hereinafter.

Figure 4:
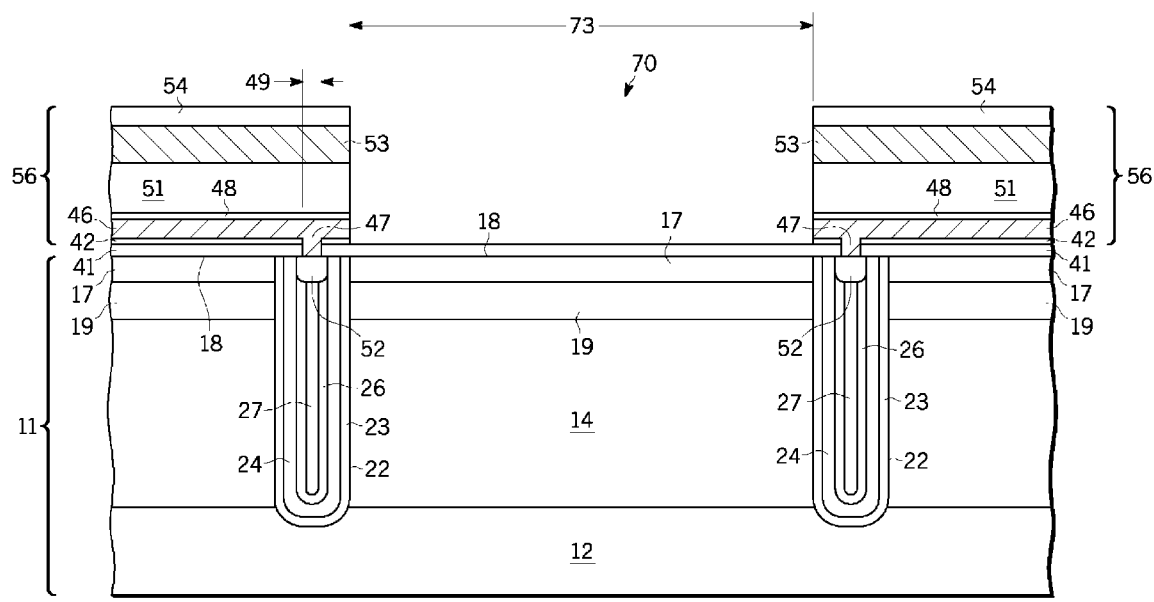

FIG. 4 shows an enlarged partial cross-sectional view of device 10 after further processing. First dielectric layer 41 is formed over major surface 18, and comprises for example, a silicon oxide about 0.1 microns to about 0.2 microns thick. A thermal oxide grown at about 750 degrees Celsius is suitable. In an optional step, a sputter etch step is used to smooth the upper or exposed surface of first dielectric layer 41. Next, second dielectric layer 42 is formed over dielectric 41, and comprises, for example, about 0.1 microns of silicon nitride. A contact photolithography and etch step is then used to form openings 47 through second dielectric layer 42 and first dielectric layer 41. This exposes a portion of major surface 18 above filled trenches 22 as shown in FIG. 4. In an exemplary embodiment, opening 47 has a width 49 on the order of about 0.5 microns to about 1.0 microns.

Conductive layer 46 is then formed over second dielectric layer 42 and contacts or couples to filled trenches 22 through openings 47. In an exemplary embodiment, conductive layer 46 comprises about 0.1 microns of polysilicon, and is either deposited doped or undoped. If conductive layer 46 is deposited initially undoped, conductive layer 46 is subsequently doped using, for example, ion implantation techniques. In this exemplary embodiment, conductive layer 46 is doped with boron to provide a contact to p-type layer 26. A boron ion implant dose of about $5.0 \times 10^{15}$ to about $1.0 \times 10^{16}$ atoms/cm$^2$ with an implant energy of about 60 KeV is sufficient for doping conductive layer 26. During a subsequent heat treatment step, dopant from conductive layer 46 diffuses into filled trenches 22 to form p-type regions 52.

Next, third dielectric layer 48 is formed over conductive layer 46, and fourth dielectric layer 51 is formed over third dielectric layer 48. Third dielectric layer 48 comprises, for example, silicon nitride (e.g., about 0.05 microns in thickness), and dielectric layer 51 comprises a deposited oxide (e.g., about 0.7 microns in thickness). Conductive layer 53 is then formed over fourth dielectric layer 51, and comprises for example, n-type polysilicon (e.g., about 0.3 microns in thickness). A protective layer 54 is formed over conductive layer 53, and comprises for example, about 0.15 microns of silicon nitride.

A photolithographic and etch step is done to etch through portions of layers 54, 53, 51, 48, 46 and 42 to provide opening 70. This also forms pedestal stack structures 56, which are comprised of portions of layers 42, 46, 48, 51, 53 and 54. In an exemplary embodiment, opening 70 has a width 73 on the order of about 5.0 microns to about 8.0 microns.

Figure 5:
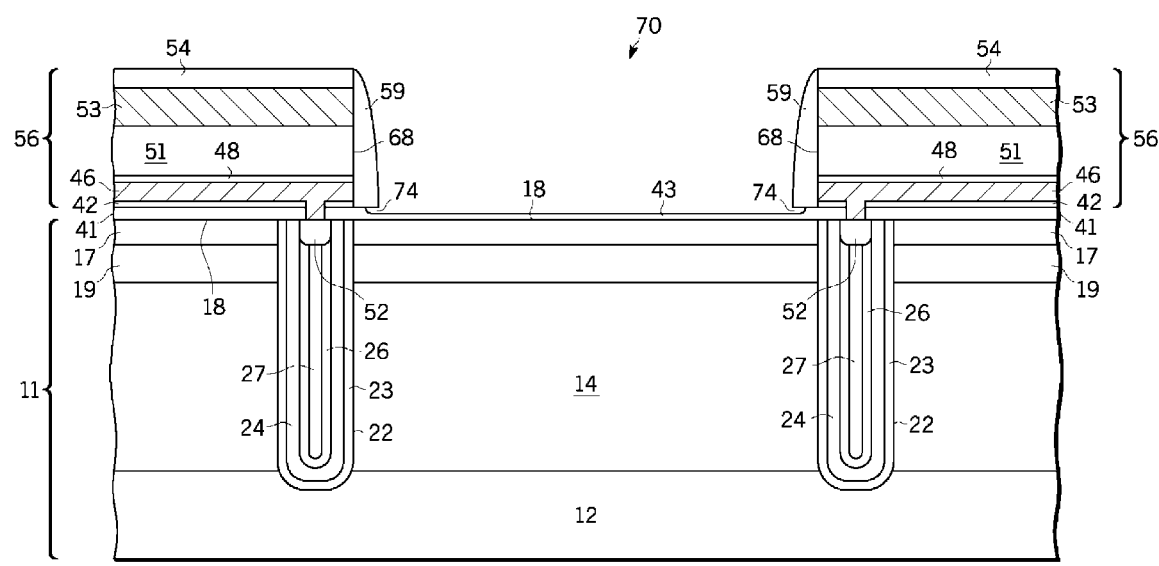

FIG. 5 shows an enlarged partial cross-sectional view of device 10 after additional processing steps that form dielectric spacers 59. In an exemplary embodiment, a silicon nitride film is deposited over pedestal stack structures 56 and first dielectric layer 41. By way of example, a silicon nitride film about 0.1 microns thick is deposited using chemical vapor deposition techniques. Next, a conventional anisotropic etch back step is used to remove portions of the silicon nitride layer over pedestal stack structures 56 and first dielectric layer 41 while leaving portions of the silicon nitride layer on sidewalls or vertical surfaces 68 of pedestal stack structures 56 to form dielectric spacers 59.

A silicon oxide wet etch is then used to remove portions of dielectric layer 41 within opening 70. By way of example, a diluted hydrofluoric acid (e.g., 50:1) is used to etch dielectric layer 41. In an exemplary embodiment, the etch time is prolonged (e.g., 8 to 15 minutes) in order to undercut or remove material from dielectric layer 41 from beneath dielectric spacers 59 to form recessed portions 74. Recessing dielectric layer 41 in this manner ensures that channels 45 (shown in FIG. 1) formed in body region 31 extend into layer 17 to allow channel current to flow more efficiently. In an exemplary embodiment, portions 74 are recessed under dielectric spacers 59 a distance of about 0.1 microns. A thermal silicon oxide is then grown on major surface 18 within opening 70 to thickness of about 0.08 microns to form gate dielectric layer 43.

Figure 6:
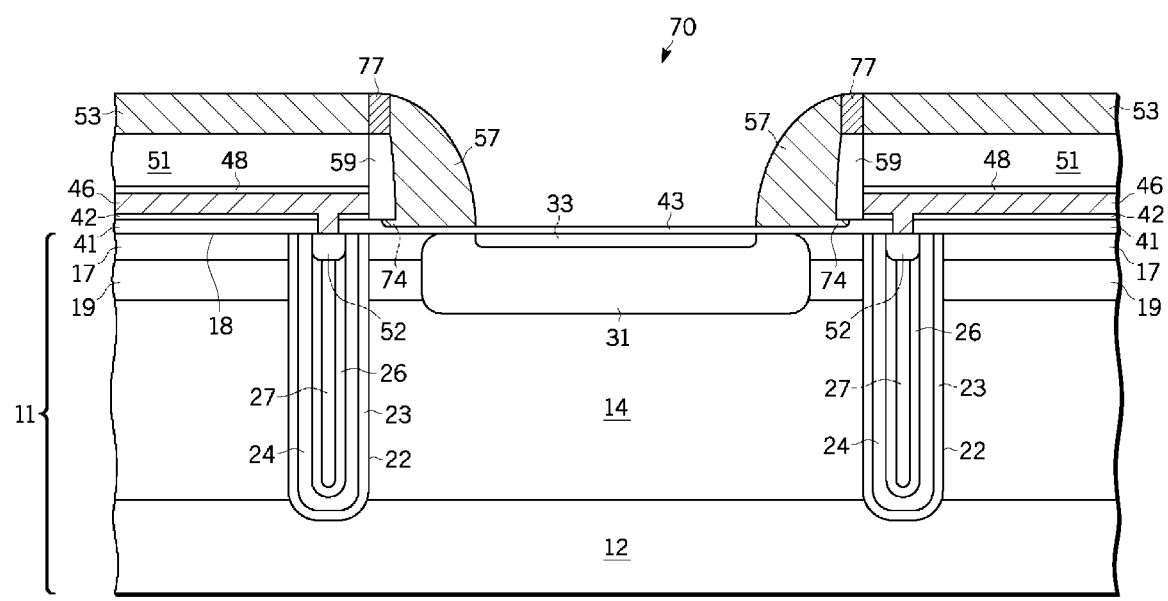

FIG. 6 shows an enlarged partial cross-sectional view of device 10 after further processing. A conformal layer of semiconductor material is deposited over device 10 to a thickness of about 0.1 microns to about 0.15 microns. Boron dopant in then introduced through opening 70 and the conformal layer of semiconductor material into major surface 18 to provide p-type dopant for body region 31. In an exemplary embodiment, the conformal layer of semiconductor material comprises undoped polysilicon, and the boron is implanted through the undoped polysilicon into layer 17. An ion implant dose of about $1.0 \times 10^{13}$ atoms/cm$^2$ and an implant energy of about 160 KeV is suitable for a 650 volt device. After the implant step, a clean or etch process is used to clean the surface of the conformal layer of semiconductor material.

A second conformal layer of semiconductor material is then deposited over the first conformal layer and both layers are etched to provide spacer gates 57. In an exemplary embodiment, the second conformal layer of semiconductor material comprises about 0.8 microns of n-type polysilicon, which may be doped during the deposition process or doped subsequently using ion implantation or other doping techniques. After spacer gates 57 are formed, an additional 0.015 microns of gate dielectric (e.g., silicon oxide) is added to the surface of spacer gates 57 and exposed portions of gate oxide 43.

In an exemplary embodiment, the etch step exposes dielectric layer 54 and the upper portions of dielectric spacers 59. Protective layer 54 and the upper portions of dielectric spacers 59 are then etched so that protective layer 54 is removed, and upper portions of dielectric spacers 59 are removed between spacer gates 57 and conductive layers 53.

In a further step, conductive material such as polysilicon is deposited to provide connective conductive portions 77. Connective conductive portions 77 couple or electrically connect spacer gates 57 to conductive layers 53. An n-type doping step is then done to dope connective conductive portions 77, and to provide dopant for source regions 33. In an exemplary embodiment, an arsenic implant dose of $3.0 \times 10^{15}$ atoms/cm$^2$ with an implant energy of 80 KeV is used for this doping step.

Figure 7:
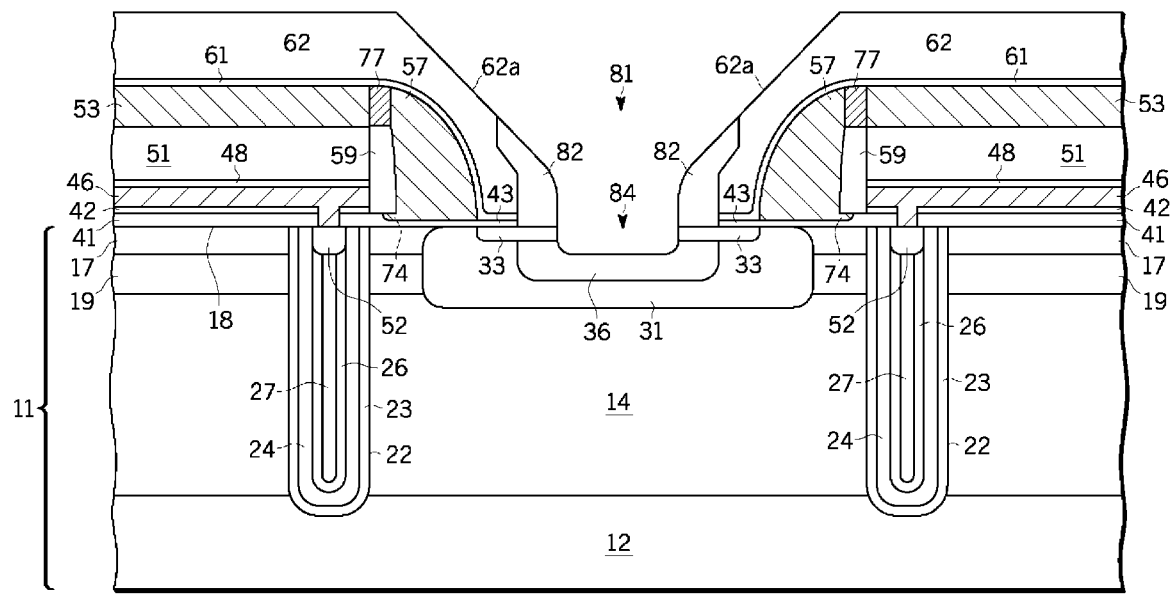

FIG. 7 shows an enlarged partial cross-sectional view of device 10 after further steps in fabrication. Fifth dielectric layer 61 is deposited, and comprises for example, about 0.05 microns of silicon nitride. ILD layer 62 is then deposited over fifth dielectric layer 61. In an exemplary embodiment, ILD layer 62 comprises a deposited silicon oxide about 0.8 microns in thickness. An optional ILD taper etch is used to taper portions 62a of ILD layer 62, which helps with step coverage for subsequently formed layers.

Next, a conventional photolithographic and etch step is used to form contact opening 81, which exposes a portion of major surface 18. Contact region 36 is then formed through opening 81 using a p-type ion implantation step. By way of example, a boron ion implant dose of $3.0 \times 10^{14}$ atoms/cm$^2$ and an implant energy of 80 KeV is used. A conformal spacer layer is then deposited and etched to form spacers 82. In an exemplary embodiment, a 0.3 micron layer of silicon nitride is deposited and etched to form spacers 82. A rapid anneal step is used at this point to activate and diffuse the various ion implants. For example, device 10 is exposed to a temperature of about 1030 degrees Celsius for about 45 seconds.

An etch step is then used to remove a portion of major surface 18 to form recessed portion 84. This allows source contact layer 63 to contact both source regions 33 and contact region 36, which shorts these regions together. Spacers 82 are then removed. In subsequent processing, source contact layer 63 is deposited and patterned. Substrate 12 is then optionally thinned, and drain contact layer 66 is deposited to provide the structure shown in FIG. 1. Although not shown in FIGS. 2-7, a photolithographic and etch step is used during the fabrication stages described for example, in FIGS. 4-6 to expose portions of conductive layer 46 to provide openings where source contact region 63 couples to conductive layer 46 as shown in FIG. 1. It is further understood that other conductive layers such as silicide layers may be formed before depositing source contact layer 63.

Figure 8:
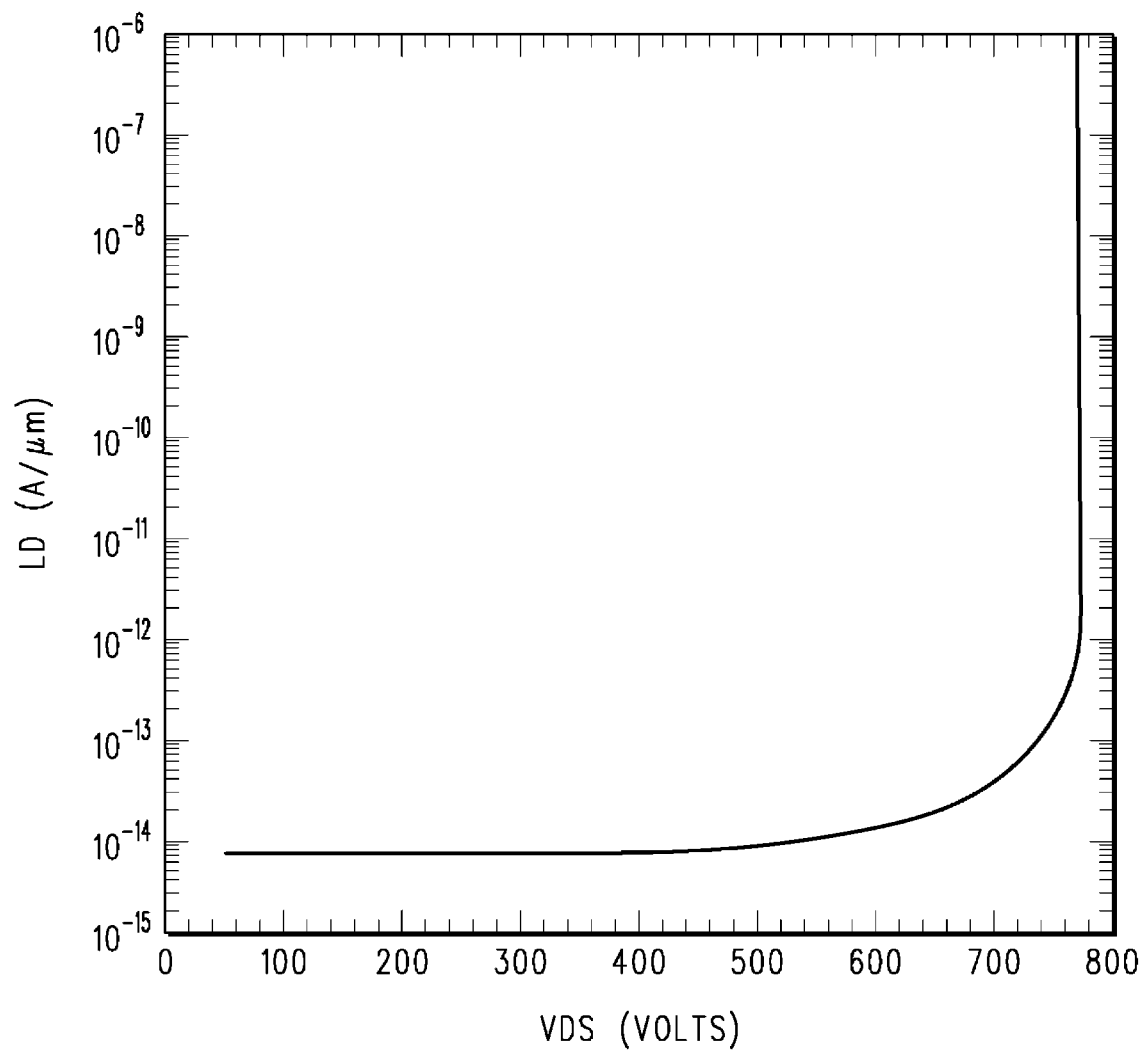
FIG. 8 is graph showing a breakdown voltage characteristic for the switching device of FIG. 1.

FIG. 8 is a graph depicting breakdown voltage (BVdss) characteristics for device 10 in accordance with the present invention, and in accordance with the processing parameters described herein. As shown in FIG. 8, device 10 exhibited a nominal breakdown voltage from drain to source of about 750 volts. Additionally and as shown in FIG. 8, device further exhibited low leakage below breakdown.

Figure 9:
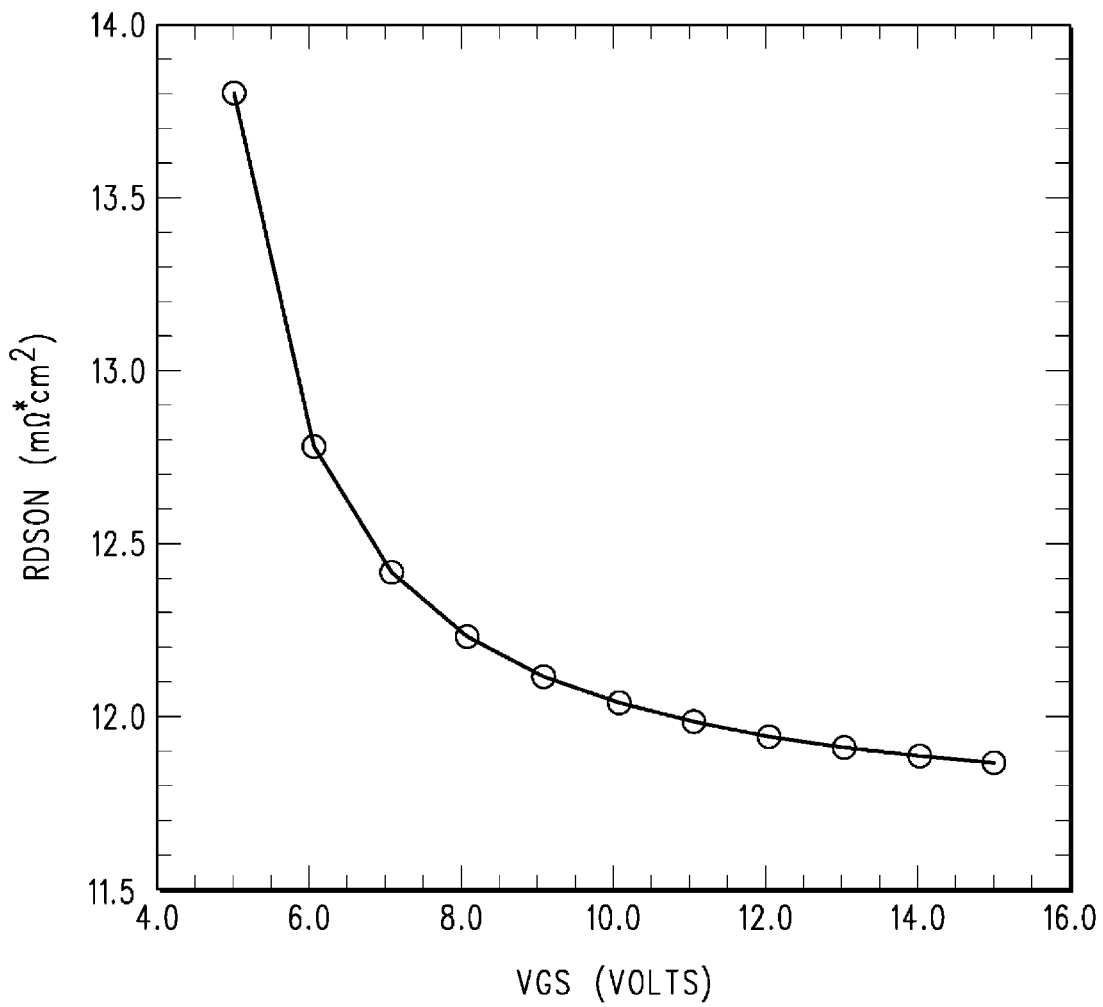
FIG. 9 is a graph showing on-state resistance characteristic for the switching device of FIG. 1.

FIG. 9 is a graph depicting on-state resistance (Rdson) characteristics for device 10 in accordance with the present invention, and in accordance with the processing parameters described herein. Device 10 exhibits excellent Rdson characteristics compared to conventional superjunction devices with similar BVdss, which have typical Rdson values on the order of 36 milli-ohm cm$^2$.

Figure 10:
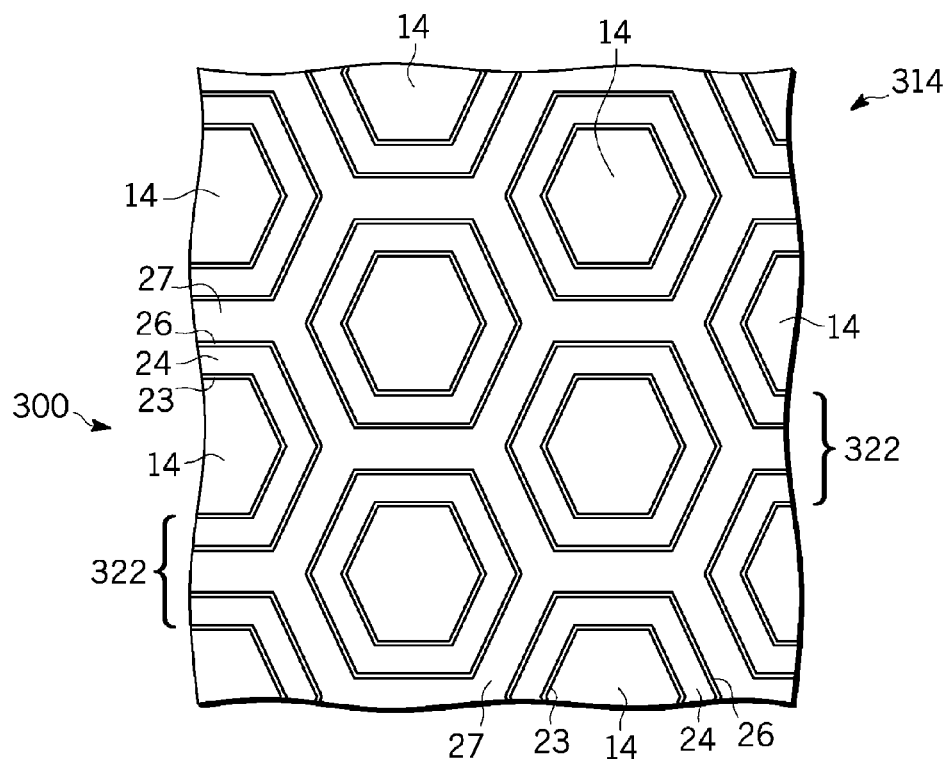
FIG. 10 illustrates an enlarged partial top view of a cell structure suitable for a switching device in accordance with the present invention.

FIG. 10 shows an enlarged partial cross-sectional view of a cell structure 300 suitable for device 10 in accordance with the present invention. Cell structure 300 is shown with a filled trench 322 in accordance with one embodiment of the present invention that surrounds a plurality 314 of polygonal shaped regions of semiconductor layer 14 where the active devices or cells are formed. It is understood that the polygonal shaped regions may have rounded corners, and that other shapes including round, square, rectangular, or the like are suitable. One feature of cell structure 300 is that it provides for a high packing density, which improves Rdson and current carrying capability. In accordance with present invention filled trenches 322 include n-type layers 23, intrinsic layers 24 and 27, and p-type layers 26.

Figure 11:
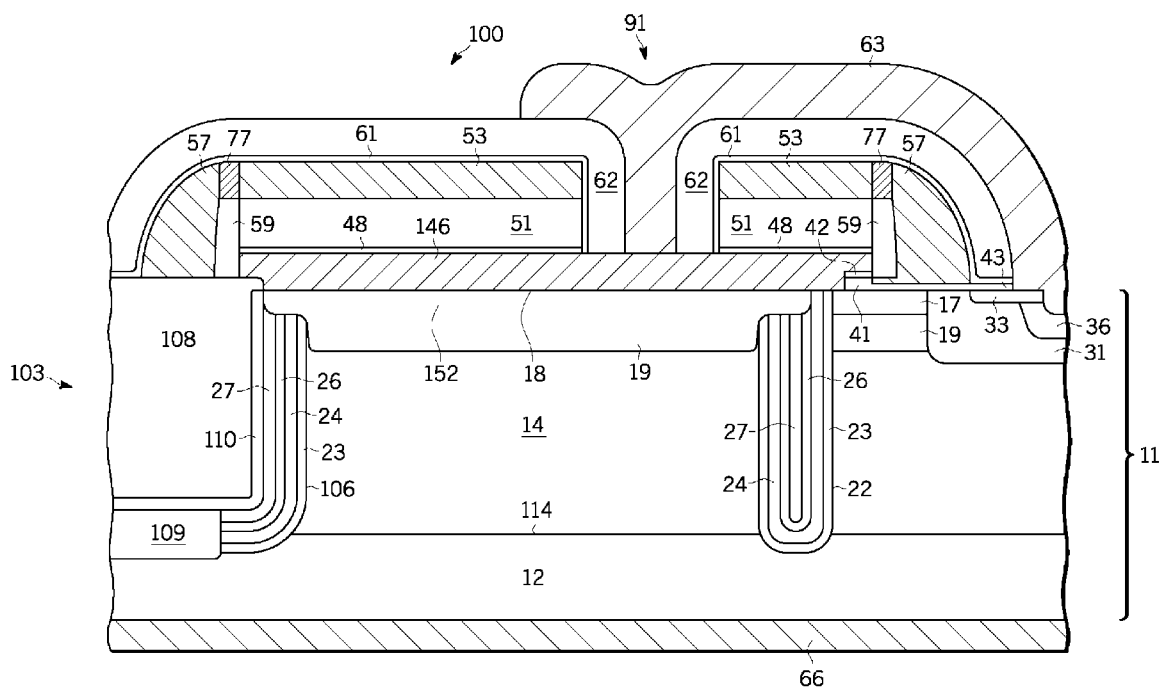
FIG. 11 illustrates an enlarged partial cross-sectional view of a switching device and edge termination structure in accordance with the present invention.

FIG. 11 is an enlarged partial cross-sectional view of another portion of device 10, which shows an optional edge termination structure 100 in accordance with the present invention. One of the features of termination structure 100 is that it incorporates the basic components of device 10, which saves on processing costs. Termination structure 100 includes a conductive contact layer or conductive layer 146, which is formed over and adjacent to major surface 18. In an exemplary embodiment, conductive contact layer 146 comprises the same material as conductive layer 46, and is formed at the same time. For example, conductive contact layer 146 comprises p-type polysilicon. After a heat treatment, p-type dopant diffuses from conductive contact layer 146 to form p-type doped layer 152, which counter-dopes n-type layer 17 and couples to optional p-type layer 19. FIG. 11 further shows conductive contact layer 146 coupled to source contact layer 63 through opening 91.

An isolation trench 103 is formed at the periphery of device 10, and comprises, for example, an etched trench 106 that is filled with a dielectric material 108. Optionally, a thermal oxide layer 110 is formed first to line the sidewalls and/or the lower surface of isolation trench 103.

In an alternative embodiment and as shown in FIG. 11, isolation trench 103 further includes layers of semiconductor material, which are formed at the same time as filled trenches 22. By way of example, the layers of semiconductor material include n-type layer 23, intrinsic or buffer layer 24, p-type layer 26, and intrinsic or buffer layer 27 as described in conjunction with FIG. 1. If the layers of semiconductor material are excluded, then trench 106 is formed separately from filled trenches 22 during fabrication.

In an exemplary embodiment, dielectric material 108 comprises a silicon oxide formed using spin-on glass (SOG), BPSG, PSG, and/or TEOS deposition techniques. After the oxide is formed, the upper surface of the dielectric region is planarized using etch back or chemical mechanical planarization techniques, combinations thereof, or the like. In an exemplary embodiment, trench 106 has width of about 30 microns to about 100 microns, and is formed using techniques similar to those used to form trenches 122 described in conjunction with FIG. 2. The sidewalls of trench 106 may be substantially vertical, or tapered such that the width at the bottom of trench 106 is less than the width at the top of trench 106. By way of example, dielectric material 108 and/or dielectric layer 110 extends to a depth or distance below semiconductor layer 14 as shown in FIG. 11.

In an alternative embodiment when layers 23, 24, 26, 27 are included with isolation trench 103, an n-type region 109 is incorporated into substrate 12 below trench 106 to reduce any current leakage problems associated with die separation.

In accordance with the present invention, when semiconductor layer 14 comprises p-type conductivity, the primary junction for BVdss is pn junction 114 formed by semiconductor layer 14 and n-type substrate 12. This feature simplifies edge termination structure 100, and saves on space. For example, conventional devices require a distance of about 1 to 3 times the thickness of the epitaxial layer for the termination structure. In the present invention, this distance is reduced to about one half the thickness.

In this embodiment, junction 114 is more planar than in conventional devices because the junction depletes up from substrate 12 instead of down and across from body region 31. Furthermore, since conductive contact layer 146 is coupled to semiconductor layer 14 through doped regions 152 and 19, junction 114 laterally extends to the edge of device 10. In this way, an optimized planar junction with optimized BVdss is realized. Isolation trench 103 functions, among other things, to passivate junction 114.

Figure 12:
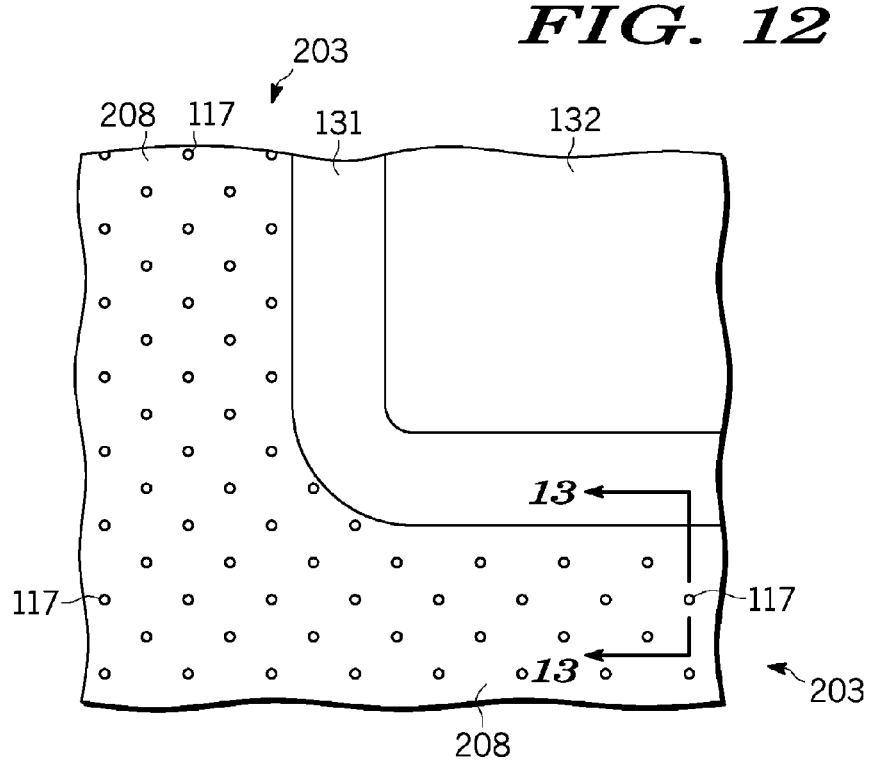
FIG. 12 illustrates an enlarged partial top view of an alternative trench isolation structure in accordance with the present invention.

FIG. 12 shows an enlarged partial top view of an alternative isolation trench 203 in accordance with the present invention. Region 131 designates that portion of device 10 used for the termination structure as described in conjunction with FIG. 11, and region 132 designates that portion of device 10 used for the active structure as described in FIG. 1. Isolation trench 203 includes a plurality or matrix of pillars or shapes 117 that are formed when the isolation trench is etched. In an exemplary embodiment, adjacent rows of shapes 117 are offset with respect to each other as shown in FIG. 12 so that shapes 117 are substantially equidistant from each other. In an exemplary embodiment, pillars 117 are spaced apart about 5 microns to about 15 microns.

Figure 13:
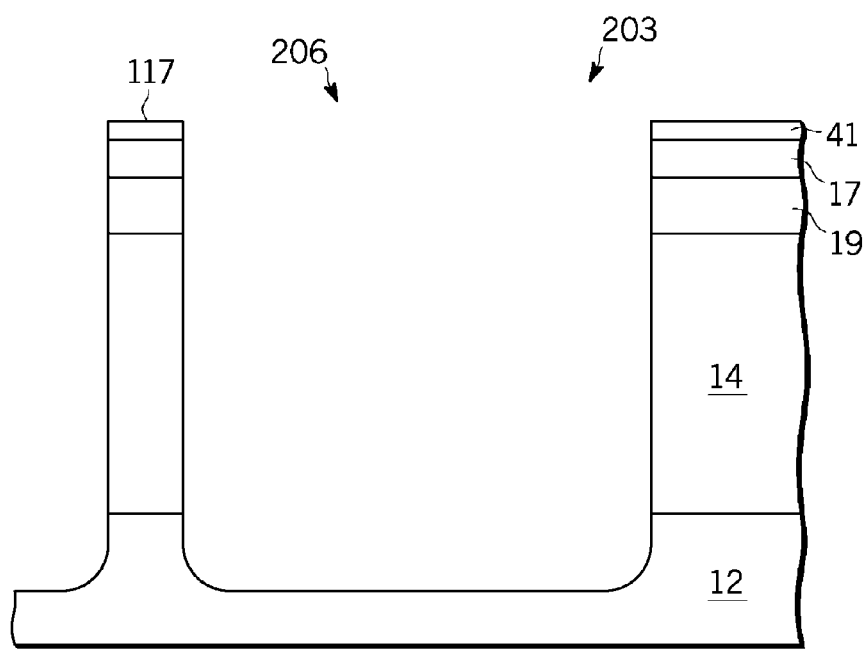
FIG. 13 illustrates an enlarged partial cross-sectional view of the trench isolation structure of FIG. 12 taken along reference line 13-13 at an early stage of fabrication.

By way of example, shapes 117 are pillars or regions of portions of body of semiconductor material 11. In an exemplary embodiment, shapes 117 are comprised of substrate 12, semiconductor layer 14, p-type layer 19, n-type layer 17, and dielectric layer 41, and have a width or diameter of about 0.8 microns to about 1.0 microns. This is more clearly shown in FIG. 13, which is an enlarged cross-sectional view of a portion of isolation trench 203 taken along reference line 13-13 of FIG. 12. FIG. 13 shows isolation trench 203 prior to the formation of dielectric material 208. Conventional photolithographic and etch techniques are used to form trenches 206 and shapes 117. For example, DRIE is used with a fluorine or chlorine based chemistry.

Figure 14:
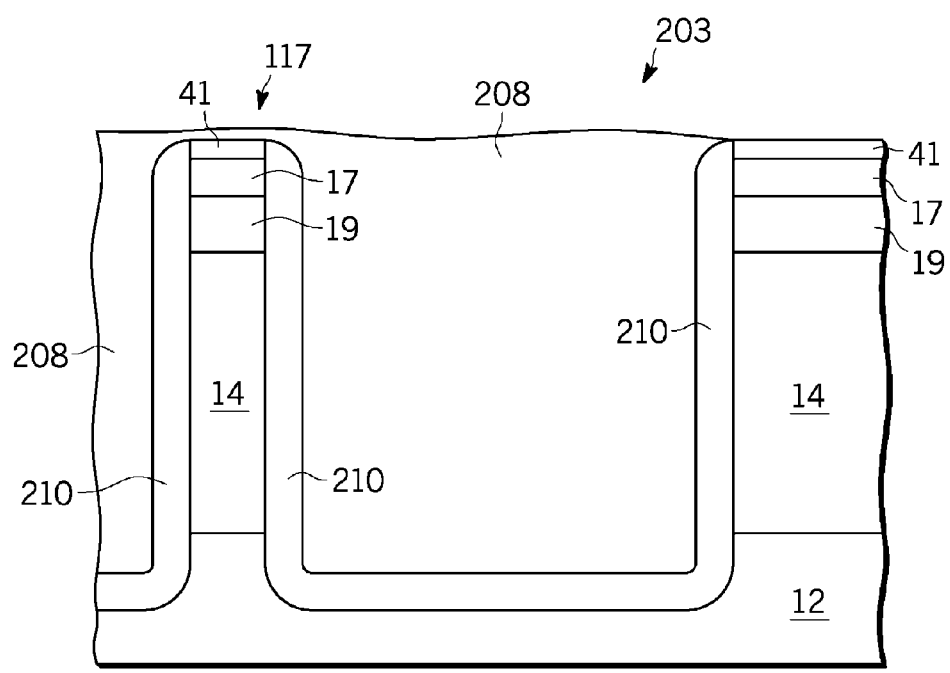
FIG. 14 illustrates an enlarged partial cross-sectional view of the structure of FIG. 13 after further processing.

After trench 206 and shapes 117 are formed, dielectric layer 210 is formed as shown in FIG. 14. By way of example, dielectric layer 210 comprises a thermally grown silicon oxide. Next, dielectric layer 208 is deposited and planarized. In an exemplary embodiment, dielectric layer 208 comprises a spin-on glass. In accordance with the present invention, shapes 117 reduce dishing effects when dielectric layer 208 is deposited, which provides a more planar surface, better passivation, and a more reliable device. Shapes 117 may be round, square, rectangular, polygonal, trapezoidal, elliptical, triangular, combinations thereof, or the like. The shapes may further include rounded corners.

Figure 15:
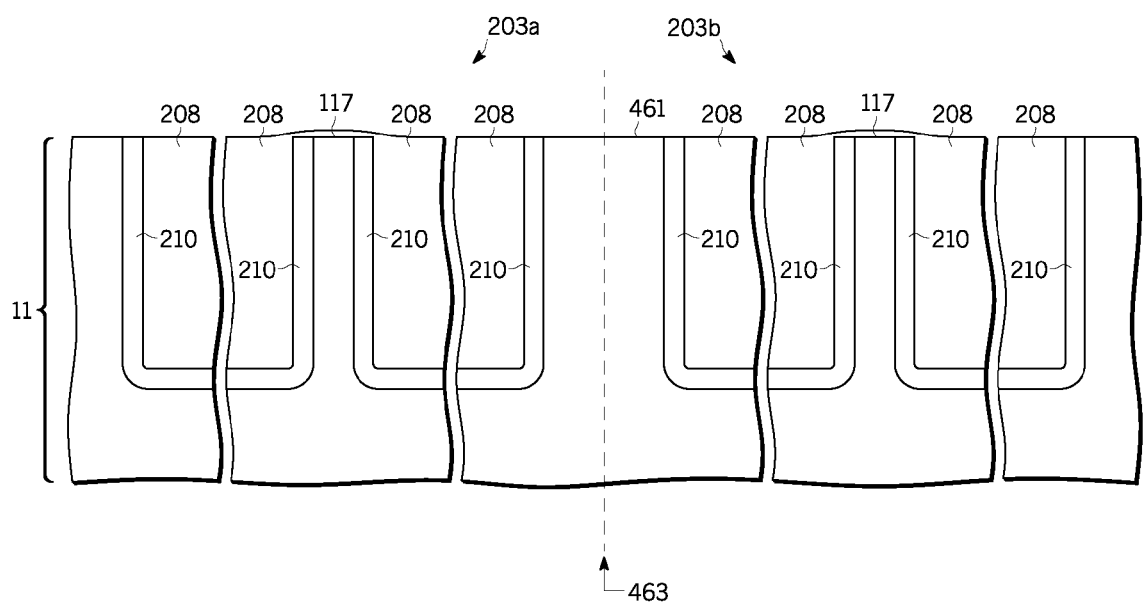
FIG. 15 illustrates an enlarged partial cross-sectional view of a further trench isolation structure in accordance with the present invention.

FIG. 15 shows an enlarged partial cross-sectional view of adjacent or a plurality of isolation trenches 203a and 203b depicted as portions of two devices separated by a scribe grid or region 461. In this embodiment, adjacent devices 10 on a semiconductor wafer include scribe grid 461 that comprises body of semiconductor material 11 instead of dielectric materials 208 and 210 being continuous between adjacent die. This allows a die separation device such as a dicing saw to separate the die along centerline 463, which provides for more robust die separation.

Figure 16:
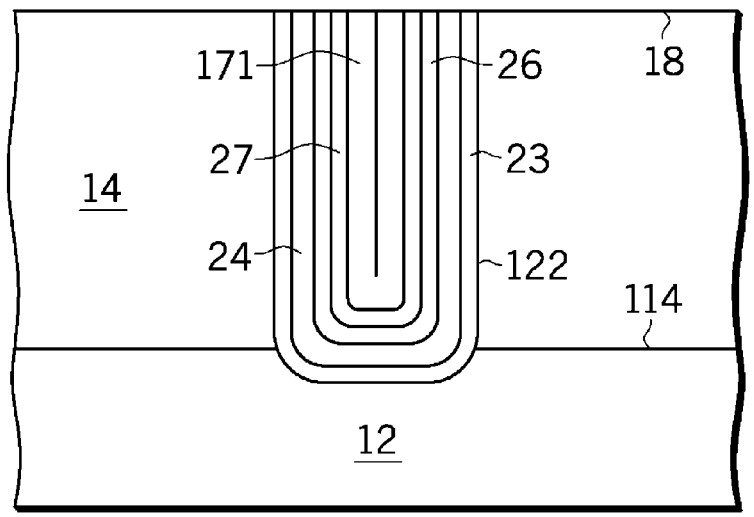
FIG. 16 illustrates an enlarged partial cross-sectional view of an alternative embodiment of a charge compensation trench structure.

FIG. 16 shows an enlarged partial cross-sectional view of an alternative embodiment of a charge compensating trench region, deep trench charge compensation region, charge compensating filled trench or charge compensation region 122. Charge compensation trench 122 is similar to trench 22 except that a dielectric layer or passivation layer or liner 171 is formed as an innermost layer or region or core of the structure. That is, passivation liner 171 is formed overlying the outermost epitaxial layer (e.g., layer 27) within the trench region.

In one embodiment, liner 171 is configured to compensate for, protect against, or overcome lattice imperfections that may occur in the outermost epitaxially grown layer (e.g., layer 27) as it is formed. Of particular concern is the growth interface that is left when outermost layer 27 fills the trench. The growth interface may have a large concentration of imperfections. Such imperfections lead to undesired stresses, or trap unwanted impurities in certain applications, which lead to undesired conduction channels or short circuit paths in a charge compensated structure (e.g., structure 10). Liner 171 is configured to increase electrical resistance at the core of the charge compensation structure, which prevents unwanted current flow at high electric fields or at high temperatures.

Liner 171 comprises for example, an oxide, a nitride, or a combination of oxide(s) and nitride(s). In one embodiment, liner 171 comprises a dry oxide. In one embodiment, a conventional pre-diffusion clean step is used prior to forming liner 171.

Figure 17:
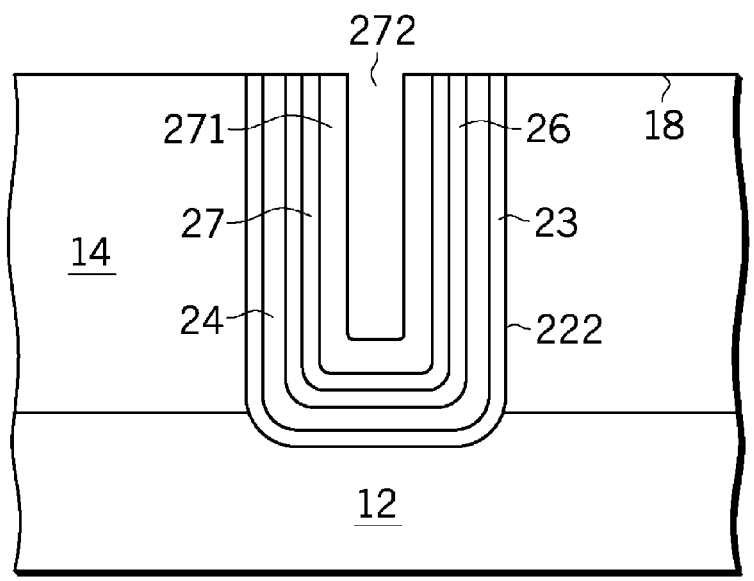
FIG. 17 illustrates an enlarged partial cross-sectional view of a further embodiment of a charge compensation trench structure.

FIG. 17 shows an enlarged partial cross-sectional view of an alternative embodiment of a charge compensating trench region, deep trench charge compensation region, charge compensating filled trench or charge compensation region 222. Charge compensation trench 222 is similar to trench 122 except that a dielectric layer or passivation layer or liner 271 is formed leaving a gap, void, or air gap 272 as the innermost region or core of the structure. In one embodiment, gap 272 extends from major surface 18 into semiconductor layer 14 as shown in FIG. 17. In an alternative embodiment, gap 272 only occupies a portion of the core.

In summary, a new switching device structure having deep trench charge compensation has been described including a method of manufacture. Also, a ground plane structure has been described that is suitable for the device of the present invention as well as other semiconductor devices. In addition, edge termination structures have been described that are suitable for the device of the present invention as well as other semiconductor devices.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device comprising:
   a body of semiconductor material; and
   a charge compensation region including a trench formed in
      the body of semiconductor material, wherein the trench comprises a pair of opposite conductivity type single crystal semiconductor layers overlying surfaces of the trench, and wherein a first intrinsic layer separates the pair, and wherein a passivation liner is formed overlying an outermost one of the pair.

2. The device of claim 1, wherein the passivation liner comprises an oxide.

3. The device of claim 1 further comprising a conductive layer coupled to the charge compensation region.

4. The device of claim 1, wherein the passivation liner comprises a dielectric material.

5. The device of claim 1, wherein the passivation liner comprises a nitride.

6. The device of claim 1, wherein the passivation liner comprises an oxide and a nitride.

7. The device of claim 1, wherein the charge compensation region further includes a void.

8. The device of claim 7, wherein the void is formed at a centralized portion of the charge compensation region.

9. A semiconductor device comprising:
a body of semiconductor material; and
a trench formed in the body of semiconductor material;
a first layer comprising a single crystal semiconductor material formed overlying surfaces of the trench, wherein the first layer comprises a first conductivity type;
a first intrinsic layer formed overlying the first layer;
a second layer comprising a single crystal semiconductor material formed overlying the first intrinsic layer, wherein the second layer comprises a second conductivity type, and wherein the first intrinsic layer is configured to reduce intermixing of dopants between the first and second layers; and
a passivation layer formed overlying the second layer to form a charge compensation region.

10. The device of claim 9 further comprising a conductive layer coupled to the charge compensation region.

11. The device of claim 9, wherein the trench includes a void.

12. The device of claim 9, wherein the passivation layer comprises a dry oxide layer.

13. A semiconductor device comprising:
a body of semiconductor material having first and second opposing major surfaces;
a trench formed in the body of semiconductor material;
a first semiconductor layer of a first conductivity type formed adjoining surfaces of the trench;
a first intrinsic layer formed adjoining the first semiconductor layer;
a second semiconductor layer of a second conductivity type formed adjacent to the first intrinsic to form a charge compensated region;
a passivation layer formed overlying the second semiconductor layer;
a first doped region in the body of semiconductor material formed adjacent the charge compensated region, wherein the first doped region comprises the second conductivity type;
a second doped region formed in the first doped region and comprising the first conductivity type; and
a control electrode formed adjacent the first and second doped regions.

14. The device of claim 13 further comprising a conductive layer coupled to the charge compensated region.

15. The device of claim 13, wherein the control electrode comprises a spacer gate structure.

16. The device of claim 13, wherein the passivation layer comprises an oxide layer.

17. The device of claim 13, wherein the passivation layer comprises a nitride layer.

18. The device of claim 13, wherein the passivation layer comprises an oxide layer and a nitride layer.

19. The device of claim 13, wherein the charge compensated region has a void.

* * * * *